(12) United States Patent
Tian

(10) Patent No.: US 9,719,280 B2
(45) Date of Patent: Aug. 1, 2017

(54) MULTI-PIN HINGE AND ELECTRONIC DEVICE

(71) Applicant: Lenovo (Beijing) Co., Ltd., Beijing (CN)

(72) Inventor: Ping Tian, Beijing (CN)

(73) Assignee: Lenovo (Beijing) Co., Ltd., Beijing (CN)

( * ) Notice: Subject to any disclaimer, the term of this patent is extended or adjusted under 35 U.S.C. 154(b) by 7 days.

(21) Appl. No.: 14/835,770

(22) Filed: Aug. 26, 2015

(65) Prior Publication Data
US 2016/0362919 A1 Dec. 15, 2016

(30) Foreign Application Priority Data
Jun. 12, 2015 (CN) .......................... 2015 1 0324508

(51) Int. Cl.
| | | |
|---|---|---|
| *E05D 7/00* | (2006.01) | |
| *E05D 3/12* | (2006.01) | |
| *E05D 3/06* | (2006.01) | |
| *H04M 1/02* | (2006.01) | |
| *H05K 5/02* | (2006.01) | |

(52) U.S. Cl.
CPC .............. *E05D 3/122* (2013.01); *E05D 3/06* (2013.01); *H04M 1/022* (2013.01); *H05K 5/0226* (2013.01); *E05Y 2900/606* (2013.01)

(58) Field of Classification Search
CPC .... E05D 3/00; E05D 3/04; E05D 3/06; E05D 3/12; E05D 3/14; E05D 3/16; E05D 3/122; E05D 7/00; Y10T 16/541; Y10T 16/5476
USPC ........................................... 16/354, 365–366
See application file for complete search history.

(56) References Cited

U.S. PATENT DOCUMENTS

| 2,206,739 A | 7/1940 | Brogren .................... E05D 3/06 16/354 |
| 8,720,011 B1 | 5/2014 | Hsu ......................... E05D 3/122 16/354 |

(Continued)

FOREIGN PATENT DOCUMENTS

| GB | 2171448 A | 8/1986 |
| WO | WO-2009115908 A1 | 9/2009 |

OTHER PUBLICATIONS

First German Office Action regarding Application No. 10 2015 217 796.3 dated Oct. 12, 2015. English translation provided by Unitalen Attorneys at Law.

*Primary Examiner* — Roberta Delisle
(74) *Attorney, Agent, or Firm* — Harness, Dickey & Pierce, P.L.C.

(57) ABSTRACT

A multi-pin hinge includes a first mounting pin, a second mounting pin, a linkage pin assembly, a first single-pin gear, a second single-pin gear and a double-pin gear assembly. The first single-pin gear is sleeved on the first mounting pin, the second single-pin gear is sleeved on the second mounting pin, and the linkage pin assembly is movably connected between the first mounting pin and the second mounting pin by the double-pin gear assembly. The multi-pin hinge connect two bodies of an electronic device to two mounting pins, thus a first body is rotatable around a second body without directly contacting the second body, thereby avoiding providing a gap or a protruding block on the two bodies. An electronic device using the multi-pin hinge can avoid providing a protruding block and/or a groove, thus the electronic device has a regular appearance and structure.

16 Claims, 3 Drawing Sheets

(56) References Cited

U.S. PATENT DOCUMENTS

| | | | |
|---|---|---|---|
| 8,869,352 B2 | 10/2014 | Hsu | E05D 3/122 16/354 |
| 8,869,353 B2 | 10/2014 | Hsu | E05D 3/14 16/364 |
| 9,057,215 B1 | 6/2015 | Horng | E05D 3/12 |
| 9,134,767 B2 | 9/2015 | Chen | G06F 1/1681 |
| 9,290,976 B1 | 3/2016 | Horng | E05D 3/12 |
| 9,458,652 B2 | 10/2016 | Hsu | E05D 3/06 |
| 2011/0271486 A1 | 11/2011 | Wang et al. | |
| 2014/0174227 A1 | 6/2014 | Hsu | E05D 3/14 74/98 |
| 2015/0309541 A1 | 10/2015 | Horng | E05D 3/12 16/250 |
| 2016/0090763 A1 | 3/2016 | Hsu | E05D 3/06 16/354 |
| 2016/0161993 A1 | 6/2016 | Zhang | G06F 1/1681 361/679.09 |

“MULTI-PIN HINGE AND ELECTRONIC DEVICE”

MULTI-PIN HINGE AND ELECTRONIC DEVICE

CROSS-REFERENCE TO RELATED APPLICATIONS

This application claims the benefit of priority to Chinese Patent Application No. 201510324508.1 titled "MULTI-PIN HINGE AND ELECTRONIC DEVICE", filed with the Chinese State Intellectual Property Office on Jun. 12, 2015, the entire disclosure of which is incorporated herein by reference.

TECHNICAL FIELD

The present application relates to the technical field of mechanical industry, more specifically to a multi-pin hinge, and further relates to an electronic device using the multi-pin hinge.

BACKGROUND

A hinge is a mechanical device configured to connect two bodies and allow the two bodies to be rotatable with respect to each other, to form an opening and closing device.

There are various kinds of hinges presently, and a hinge commonly used in an electronic device includes a hinge pin, a first body of the electronic device is fixedly connected to the hinge pin, and a second body of the electronic device is rotatably arranged on the hinge pin. However, the first body and the second body of the electronic device are connected to the same hinge pin by the hinge, thus at least one of the first body and the second body is required to be provided with a protruding block and a gap, to avoid an interference between the first body and the second body that may cause the two bodies to be unable to rotate with respect to each other, and in this case, the appearance of the electronic device is irregular, which can hardly meet the requirements of users.

In addition, when the hinge is used, the two bodies of the electronic device are required to be connected to the same hinge pin, even though at least one of the first body and the second body is provided with the gap or the protruding block, the first body and the second body may still interfere with each other in the rotating process, thus the first body and the second body are unable to be unfolded by a large angle, which can hardly meet the actual requirements of the users.

Therefore, technical issues urgently to be addressed by those skilled in the field are to provide a hinge device and an electronic device using the hinge device, wherein the hinge device can be easily connected to two bodies of the electronic device, and avoid providing the gap or the protruding block caused by the two bodies being connected to the same hinge pin, to improve the regularity of the electronic device.

SUMMARY

A multi-pin hinge includes a first mounting pin, a second mounting pin, a linkage pin assembly, a first single-pin gear, a second single-pin gear and a double-pin gear assembly, wherein the first single-pin gear is sleeved on the first mounting pin, the second single-pin gear is sleeved on the second mounting pin, and the linkage pin assembly is movably connected between the first mounting pin and the second mounting pin by the double-pin gear assembly.

An electronic device includes a first body and a second body hinged to the first body via a hinge device, and the hinge device is the multi-pin hinge according to any one of the above technical solutions.

BRIEF DESCRIPTION OF THE DRAWINGS

For more clearly illustrating embodiments of the present application or the technical solution in the conventional technology, drawings referred to describe the embodiments or the conventional technology will be briefly described hereinafter. Apparently, the drawings in the following description are only several embodiments of the present application, and for the person skilled in the art, other drawings may be obtained based on these drawings without any creative efforts.

REFERENCE NUMERALS IN FIGS. 1 TO 10

Figure 1:
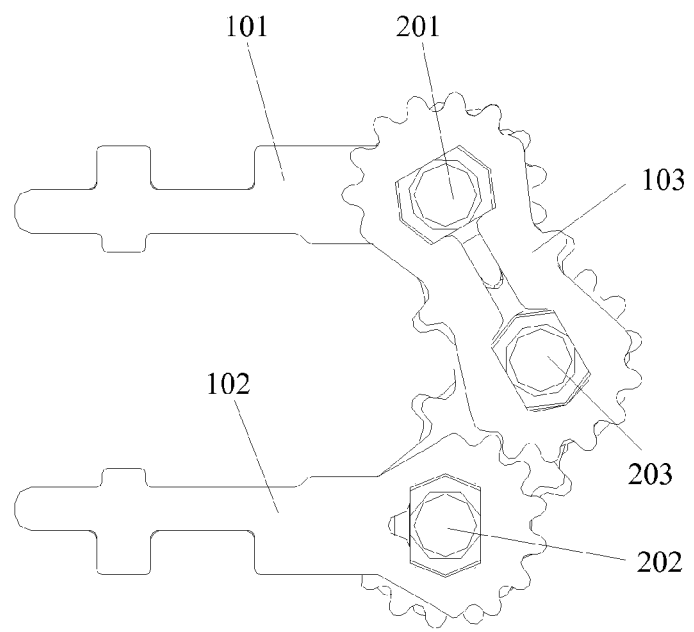
FIG. 1 is a front schematic view showing the structure of a multi-pin hinge according to an embodiment of present application.
Figure 2:
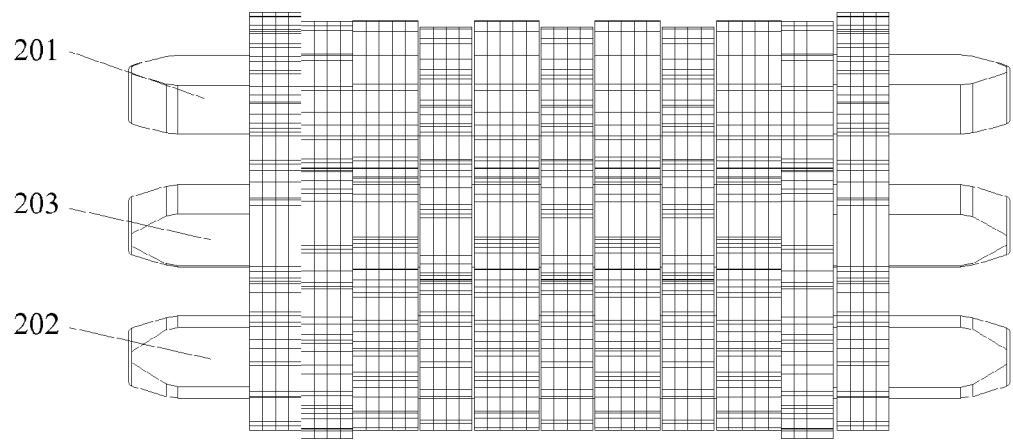
FIG. 2 is a right schematic view showing the structure of the multi-pin hinge in FIG. 1.

| 101 | first single-pin gear, | 102 | second single-pin gear, |
|---|---|---|---|
| 103 | double-pin gear, | 201 | first mounting pin, |
| 202 | second mounting pin, and | 203 | spindle. |

DETAILED DESCRIPTION

A multi-pin hinge is provided according to embodiments of the present application, which is provided with two mounting pins and a linkage pin assembly. When the multi-pin hinge is used in an electronic device, the multi-pin hinge can connect a first body of the electronic device to a first mounting pin via a first single-pin gear arranged on the first mounting pin, and connect a second body of the electronic device to a second mounting pin via a second single-pin gear arranged on the second mounting pin, thereby avoiding the first body and the second body from being connected to the same pin, avoiding providing a groove or a gap on the two bodies, and facilitating meeting the requirements of users on the appearance of the electronic device. An electronic device using the multi-pin hinge is also provided by the present application, and the two bodies of the electronic device are not required to be provided with the groove and/or a protruding block configured to connect the two bodies to the same pin, thus the electronic device has a regular appearance and structure, and can meet the users' requirements.

The technical solutions in the embodiments of the present application will be described clearly and completely hereinafter in conjunction with the drawings in the embodiments of the present application. Apparently, the described embodiments are only a part of the embodiments of the present application, rather than all embodiments. Based on the embodiments in the present application, all of other embodiments, made by the person skilled in the art without any creative efforts, fall into the scope of the present application.

Referring to FIGS. 1 to 10, a multi-pin hinge is provided according to embodiments of the present application, which includes a first mounting pin 201, a second mounting pin 202, a linkage pin assembly, a first single-pin gear 101, a second single-pin gear 102 and a double-pin gear assembly. The first single-pin gear 101 is configured to be fixedly connected to a first body of an electronic device and is sleeved on the first mounting pin 201. The second single-pin gear 102 is configured to be fixedly connected to a second body of the electronic device and is sleeved on the second mounting pin 202. The linkage pin assembly is movably connected between the first mounting pin 201 and the second mounting pin 202 via the double-pin gear assembly.

In the multi-pin hinge according to the present application, in addition to the first mounting pin 201 and the second mounting pin 202, the linkage pin assembly is also provided, and the linkage pin assembly is movably connected between the first mounting pin 201 and the second mounting pin 202 via the double-pin gear assembly. In use, the first single-pin gear 101 connects the first body of the electronic device to the first mounting pin 201, the second single-pin gear 102 connects the second body of the electronic device to the second mounting pin 202, that is, the first body and the second body are respectively connected to different mounting pins, thus the first body is rotatable around the second body without directly contacting the second body, thereby avoiding providing a gap or a protruding block, configured to allow the two bodies to be connected to the same hinge pin and to rotate with respect to each other, on the two bodies, and allowing the electronic device to have a regular appearance, and facilitating meeting the requirements of the users.

In addition, the multi-pin hinge can allow the first body and the second body of the electronic device to be respectively connected to two different mounting pins, and a hinge end of the first body is not in direct contact with a hinge end of the second body, which can avoid the problem that the first body and the second body cannot be unfolded by a large angle due to an interference between the hinge ends of the first body and the second body, and facilitates increasing the maximum opening angle between the first body and the second body of the electronic device.

Figure 3:
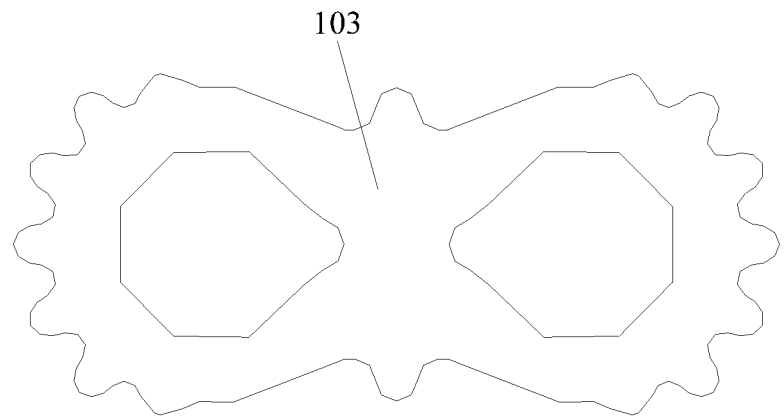
FIG. 3 is a schematic view showing the structure of a double-pin gear according to an embodiment of the present application.
Figure 4:
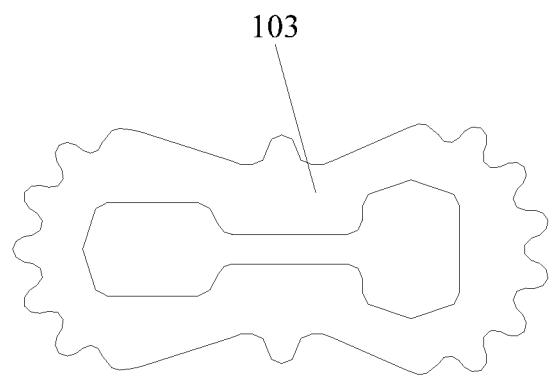
FIG. 4 is a schematic view showing the structure of another double-pin gear according to an embodiment of the present application.
Figure 5:
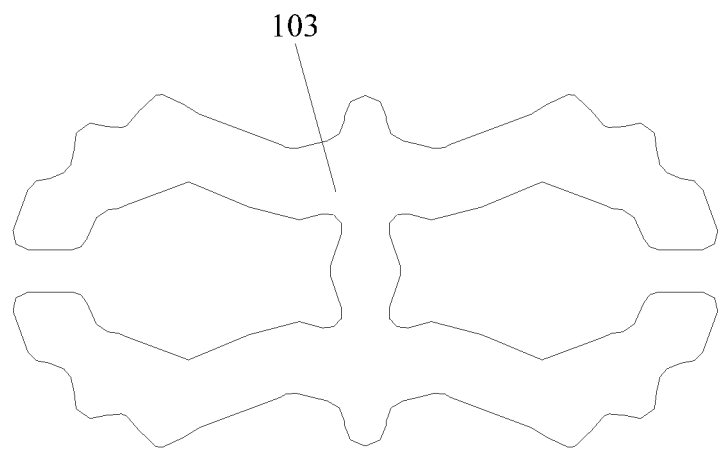
FIG. 5 is a schematic view showing the structure of yet another double-pin gear according to an embodiment of the present application.
Figure 6:
FIG. 6 is a top schematic view showing the structure of a first mounting pin, a second mounting pin or a spindle according to an embodiment of the present application.
Figure 7:
FIG. 7 is a side schematic view showing the structure of the first mounting pin, the second mounting pin or the spindle in FIG. 6.
Figure 8:
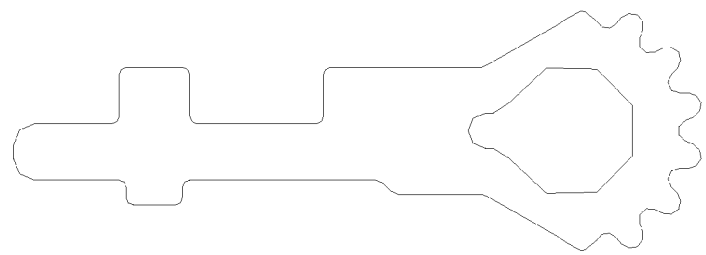
FIG. 8 is a schematic view showing the structure of a first single-pin gear or a second single-pin gear according to an embodiment of the present application.
Figure 9:
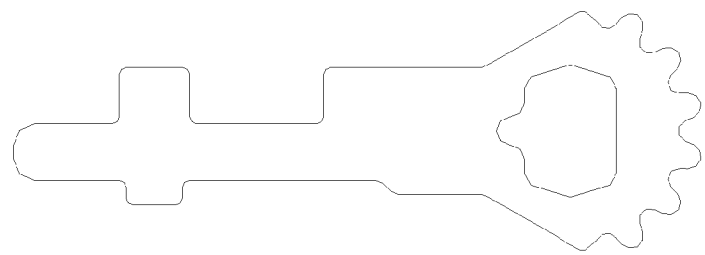
FIG. 9 is a schematic view showing the structure of another first single-pin gear or another second single-pin gear according to an embodiment of the present application.
Figure 10:
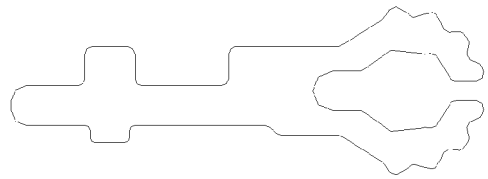
FIG. 10 is a schematic view showing the structure of yet another first single-pin gear or yet another second single-pin gear according to an embodiment of the present application.

In the multi-pin hinge according to the above embodiment, the double-pin gear assembly includes multiple double-pin gears 103, and as shown in FIGS. 3 to 5, each of the double-pin gears 103 includes a main body, and two pin holes are provided in the main body and axes of the two pin holes are in parallel with each other, and two groups of gear teeth are provided at a periphery of the main body and respectively encircle the two pin holes. As shown in FIGS. 8 to 10, each of the first single-pin gear and the second single-pin gear includes a main body gear and a mounting arm fixed at a periphery of the main body gear, the mounting arm is configured to be fixedly connected to the respective body of the electronic device, and the mounting arm is preferably formed integrally with the main body gear. Moreover, each of the double-pin gears 103 of the double-pin gear assembly is embodied as a spur gear. The linkage pin assembly includes one or more spindles 203.

In the multi-pin hinge according to the above embodiment, two ends of the double-pin gear assembly are respectively sleeved on the first mounting pin 201 and the second mounting pin 202, the middle of the double-pin gear assembly is sleeved on the linkage pin assembly, and meanwhile the double-pin gear assembly meshes with the first single-pin gear 101 and the second single-pin gear 102 respectively. In the multi-pin hinge, two ends of the double-pin gear assembly are respectively sleeved on the first mounting pin 201 and the second mounting pin 202, and the middle of the double-pin gear assembly is sleeved on the linkage pin assembly, thus the linkage pin assembly is arranged between the first mounting pin 201 and the second mounting pin 202; and at the same time, the double-pin gear assembly meshes with the first single-pin gear 101 and the second single-pin gear 102 respectively, thus the linkage pin assembly can rotate around the second mounting pin 202 together with the first mounting pin 201 in the process of the first body rotating around the second body.

In an embodiment, the linkage pin assembly includes an odd number of spindles 203, the double-pin gear assembly includes an even number of double-pin gears 103, and the number of the double-pin gears 103 is greater than the number of the spindles 203 by one.

Taking the number of the spindle 203 being one as an example, the double-pin gear assembly is embodied as including two double-pin gears 103, and correspondingly, one of the two double-pin gears 103 is sleeved on the first mounting pin 201 and the spindle 203, and another of the two double-pin gears 103 is sleeved on the second mounting pin 202 and the spindle 203. The double-pin gear 103 sleeved on the first mounting pin 201 and the spindle 203 meshes with the second single-pin gear 102, and another double-pin gear 103 sleeved on the second mounting pin 202 and the spindle 203 meshes with the first single-pin gear 101. In this way, the linkage pin assembly is movably connected between the first mounting pin 201 and the second mounting pin 202 via the double-pin gear assembly.

In the case that the number of the spindles 203 is an odd number greater than or equal to three, the number of the double-pin gears 103 of the double-pin gear assembly is greater than the number of the spindles 203 by one, and the double-pin gears 103 of the double-pin gear assembly are staggered in two rows, every row of the double-pin gears 103 are arranged in the direction from the first mounting pin 201 to the second mounting pin 202, and the double-pin gears 103 in every row of the double-pin gears 103 are respectively sleeved on two adjacent spindles 203, and sleeved on the respective mounting pin and the spindle 203 adjacent to the mounting pin. In the case that the number of the spindles 203 is three, the number of the double-pin gear 103 in every row of the double-pin gears is two; and in the case that the number of the spindles 203 is greater than three, the number of the double-pin gears 103 in every row of the double-pin gears 103 is greater than two, and correspondingly, every two adjacent double-pin gears 103 in every row of the double-pin gears 103 mesh with each other. An end portion of a double-pin gear row sleeved on the first mounting pin 201 meshes with the second single-pin gear 102, and an end portion of a double-pin gear row sleeved on the second mounting pin 202 meshes with the first single-pin gear 101.

In this embodiment, the linkage pin assembly is provided with an odd number of the spindles 203, and the double-pin gear assembly includes the double-pin gears 103 the number of which is greater than the number of the spindles 203 by one, which on one hand can ensure the multi-pin hinge to have a hinging function, and on the other hand can simplify the structure of the multi-pin to the greatest extent, thereby helping to decrease the weight of the multi-pin hinge, and facilitating lightening and thinning the electronic device using the multi-pin hinge.

In another embodiment, the linkage pin assembly is embodied as including at least one spindle 203, the double-pin gear assembly includes at least two double-pin gears 103, a first double-pin gear in the at least two double-pin gears 103 has a first end sleeved on the first mounting pin 201 and a second end sleeved on the at least one spindle 203; and a second double-pin gear in the at least two double-pin gears 103 has a first end sleeved on the second mounting pin 202 and a second end sleeved on the at least one spindle 203.

The second end of the first double-pin gear 103 meshes with the first single-pin gear 101, and the second end of the second double-pin gear 103 meshes with the second single-pin gear 102, that is, the number of the spindle 203 is one.

In the case that the linkage pin assembly is embodied as including an even number of spindles 203, the even number is defined as A, and accordingly the double-pin gear assembly at least includes A+1 double-pin gears 103, and A/2 double-pin gears 103 in the A+1 double-pin gears 103 are respectively sleeved on respective two adjacent spindles 203, thereby forming a first double-pin gear row arranged in a direction from the first mounting pin 201 to the second mounting pin 202. The remaining A/2+1 double-pin gears 103 in the A+1 double-pin gears 103 are sleeved on the two adjacent spindles 203, or sleeved on the respective spindle 203 and the mounting pin adjacent to the spindle 203, thereby forming a second double-pin gear row arranged in a direction from the first mounting pin 201 to the second mounting pin 202. Two ends of the first double-pin gear row mesh with the first single-pin gear 101 and the second single-pin gear 102 respectively, and two ends of the second double-pin gear row are sleeved on the first mounting pin and the second mounting pin respectively. Moreover, adjacent double-pin gears 103 in the second double-pin gear row mesh with each other; and in the case that the first double-pin gear row includes multiple double-pin gears 103, the adjacent double-pin gears 103 in the first double-pin gear row mesh with each other. In this embodiment, the number of the double-pin gears 103 in the double-pin gear assembly may be more than A+1, and the additional double-pin gears 103 should be able to form a new first double-pin gear row and/or a new second double-pin gear row.

An embodiment, in which the linkage pin assembly is embodied as including three spindles 203, is described as follows.

The double-pin gear assembly includes at least four double-pin gears 103. A third double-pin gear in the at least four double-pin gears 103 has a first end sleeved on the first mounting pin 201 and a second end sleeved on a first spindle, close to the first mounting pin 201, in the three spindles 203. A fourth double-pin gear in the at least four double-pin gears 103 has a first end sleeved on the second mounting pin 202 and a second end sleeved on a second spindle, close to the second mounting pin 202, in the three spindles 203. A fifth double-pin gear in the at least four double-pin gears 103 is sleeved on the first spindle and a third spindle in the three spindles 203, and a sixth double-pin gear in the at least four double-pin gears 103 is sleeved on the first spindle and the third spindle. The fifth double-pin gear has two ends respectively meshing with the fourth double-pin gear and the first single-pin gear 101, and the sixth double-pin gear has two ends respectively meshing with the third double-pin gear and the second single-pin gear 102. Of course, the number of the double-pin gears 103 may be set as an even number, such as 6, 8, 10, and the additional pair of double-pin gears 103 may be arranged in the same way as the gear pair formed by the third double-pin gear and the sixth double-pin gear, or the same way as the gear pair formed by the fourth double-pin gear and the fifth double-pin gear.

An electronic device is further provided according to an embodiment of the present application, which includes a first body and a second body hinged to the first body via a hinge device, and the hinge device is the multi-pin hinge according to the above embodiments.

The electronic device uses the multi-pin hinge according to the above embodiments, the two bodies of the electronic device are not required to be provided with a groove and/or a protruding block configured to connect the two bodies to the same hinge pin, thus the electronic device has a regular appearance and structure, and can meet the users' requirements. Of course, the electronic device according to the embodiment also has other effects of the hinge device in the above embodiments, which will not be described in detail hereinafter.

The above embodiments are described in a progressive manner. Each of the embodiments is mainly focused on describing its differences from other embodiments, and references may be made among these embodiments with respect to the same or similar portions among these embodiments.

Based on the above description of the disclosed embodiments, the person skilled in the field is capable of carrying out or using the present application. It is obvious for the person skilled in the art to make many modifications to these embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

What is claimed is:

1. A multi-pin hinge, comprising a first mounting pin, a second mounting pin, a linkage pin assembly, a first single-pin gear, a second single-pin gear and a double-pin gear assembly, wherein the first single-pin gear is sleeved on the first mounting pin, the second single-pin gear is sleeved on the second mounting pin, and the linkage pin assembly is movably connected between the first mounting pin and the second mounting pin by the double-pin gear assembly;

wherein two ends of the double-pin gear assembly are respectively sleeved on the first mounting in and the second mounting pin.

2. The multi-pin hinge according to claim 1, wherein a middle of the double-pin gear assembly is sleeved on the linkage pin assembly.

3. The multi-pin hinge according to claim 2, wherein the double-pin gear assembly respectively meshes with the first single-pin gear and the second single-pin gear.

4. The multi-pin hinge according to claim 1, wherein the linkage pin assembly comprises an odd number of spindles, the double-pin gear assembly comprises an even number of double-pin gears, and the number of the double-pin gears is greater than the number of the spindles by one.

5. The multi-pin hinge according to claim 1, wherein the linkage pin assembly comprises at least one spindle, and the double-pin gear assembly comprises at least two double-pin gears, a first double-pin gear in the at least two double-pin gears has a first end sleeved on the first mounting pin and a second end sleeved on the at least one spindle, and a second double-pin gear in the at least two double-pin gears has a first end sleeved on the second mounting pin and a second end sleeved on the at least one spindle.

6. The multi-pin hinge according to claim 5, wherein the second end of the first double-pin gear meshes with the first single-pin gear, and the second end of the second double-pin gear meshes with the second single-pin gear.

7. The multi-pin hinge according to claim 1, wherein the linkage pin assembly comprises three spindles, and the double-pin gear assembly comprises at least four double-pin gears, a third double-pin gear in the at least four double-pin gears has a first end sleeved on the first mounting pin and a second end sleeved on a first spindle, close to the first mounting pin, in the three spindles; a fourth double-pin gear in the at least four double-pin gears has a first end sleeved on the second mounting pin and a second end sleeved on a second spindle, close to the second mounting pin, in the three spindles; a fifth double-pin gear in the at least four double-pin gears is sleeved on the first spindle and a third spindle in the three spindles; and a sixth double-pin gear in the at least four double-pin gears is sleeved on the first spindle and the third spindle.

8. The multi-pin hinge according to claim 7, wherein the fifth double-pin gear has two ends respectively meshing with the fourth double-pin gear and the first single-pin gear, and the sixth double-pin gear has two ends respectively meshing with the third double-pin gear and the second single-pin gear.

9. An electronic device, comprising a first body and a second body hinged to the first body via a hinge device, wherein the hinge device comprises a first mounting pin, a second mounting pin, a linkage pin assembly, a first single-pin gear, a second single-pin gear and a double-pin gear assembly, wherein the first single-pin gear is sleeved on the first mounting pin, the second single-pin gear is sleeved on the second mounting pin, and the linkage pin assembly is movably connected between the first mounting pin and the second mounting pin by the double-pin gear assembly; wherein two ends of the double-pin gear assembly are respectively sleeved on the first mounting pin and the second mounting pin.

10. The electronic device according to claim 9, wherein a middle of the double-pin gear assembly is sleeved on the linkage pin assembly.

11. The electronic device according to claim 10, wherein the double-pin gear assembly respectively meshes with the first single-pin gear and the second single-pin gear.

12. The electronic device according to claim 9, wherein the linkage pin assembly comprises an odd number of spindles, the double-pin gear assembly comprises an even number of double-pin gears, and the number of the double-pin gears is greater than the number of the spindles by one.

13. The electronic device according to claim 9, wherein the linkage pin assembly comprises at least one spindle, and the double-pin gear assembly comprises at least two double-pin gears, a first double-pin gear in the at least two double-pin gears has a first end sleeved on the first mounting pin and a second end sleeved on the at least one spindle, and a second double-pin gear in the at least two double-pin gears has a first end sleeved on the second mounting pin and a second end sleeved on the at least one spindle.

14. The electronic device according to claim 13, wherein the second end of the first double-pin gear meshes with the first single-pin gear, and the second end of the second double-pin gear meshes with the second single-pin gear.

15. The electronic device according to claim 9, wherein the linkage pin assembly comprises three spindles, and the double-pin gear assembly comprises at least four double-pin gears, a third double-pin gear in the at least four double-pin gears has a first end sleeved on the first mounting pin and a second end sleeved on a first spindle, close to the first mounting pin, in the three spindles; a fourth double-pin gear in the at least four double-pin gears has a first end sleeved on the second mounting pin and a second end sleeved on a second spindle, close to the second mounting pin, in the three spindles; a fifth double-pin gear in the at least four double-pin gears is sleeved on the first spindle and a third spindle in the three spindles; and a sixth double-pin gear in the at least four double-pin gears is sleeved on the first spindle and the third spindle.

16. The electronic device according to claim 15, wherein the fifth double-pin gear has two ends respectively meshing with the fourth double-pin gear and the first single-pin gear, and the sixth double-pin gear has two ends respectively meshing with the third double-pin gear and the second single-pin gear.

* * * * *